(12) United States Patent
Fukuda

(10) Patent No.: US 9,185,805 B2
(45) Date of Patent: Nov. 10, 2015

(54) METHOD OF MANUFACTURING A CIRCUIT SUBSTRATE

(75) Inventor: Yutaka Fukuda, Echizen (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 583 days.

(21) Appl. No.: 13/616,102

(22) Filed: Sep. 14, 2012

(65) Prior Publication Data

US 2013/0008586 A1 Jan. 10, 2013

Related U.S. Application Data

(60) Division of application No. 12/717,171, filed on Mar. 4, 2010, now abandoned, which is a continuation of application No. PCT/JP2008/065897, filed on Sep. 3, 2008.

(30) Foreign Application Priority Data

Sep. 6, 2007 (JP) ................................. 2007-231314
Mar. 31, 2008 (JP) ................................. 2008-092195

(51) Int. Cl.
*H05K 3/46* (2006.01)
*H05K 1/18* (2006.01)
(Continued)

(52) U.S. Cl.
CPC .............. *H05K 1/183* (2013.01); *H01L 21/481* (2013.01); *H01L 21/4853* (2013.01);
(Continued)

(58) Field of Classification Search
CPC ....... H05K 1/111; H05K 3/00; H05K 3/0073; H05K 3/02; H05K 1/0306; H05K 3/0014; H05K 3/245; H05K 3/3436; H05K 3/4007; H05K 3/4061; H05K 3/46113; H05K 3/4629; H05K 3/4697; H05K 2201/0367; H05K 2201/091; H05K 2203/0278; H05K 2203/308; H05K 2924/01005; H05K 2924/01006; H05K 2924/01047; H05K 2924/014; H05K 2224/81193; H05K 2924/15151; H01K 1/183; H01L 21/481; H01L 21/4863; H01L 23/13; H01L 23/16; H01L 23/49816; H01L 23/49827; H01L 24/81; H01L 2224/16226; H01L 2224/81136; H01L 2224/81801; H01L 2924/01004; H01L 2924/01029; H01L 2924/01033; H01L 2924/01056; H01L 2924/14; H01L 2924/15153; H01L 2924/1517; Y10T 29/4913; Y10T 29/49139; Y10T 29/49165; Y10T 156/1052; Y10T 156/10
See application file for complete search history.

(56) References Cited

U.S. PATENT DOCUMENTS 6,803,324 B2 * 10/2004 Ogawa et al. ................ 438/761
2005/0017346 A1 * 1/2005 Yamagata ..................... 257/701
2007/0119541 A1 * 5/2007 Kawabata et al. ......... 156/307.7

FOREIGN PATENT DOCUMENTS

JP 2004056115 A * 2/2004

OTHER PUBLICATIONS

Fukuda; "Circuit Substrate and Circuit Substrate Manufacturing Method"; U.S. Appl. No. 12/717,170, filed Mar. 4, 2010.
(Continued)

*Primary Examiner* — Carl Arbes
(74) *Attorney, Agent, or Firm* — Keating & Bennett, LLP

(57) ABSTRACT

A thin circuit substrate and a circuit module are arranged such that the circuit module includes an IC mounted on a circuit substrate, the IC includes an IC body and an solder bump located on a mounting surface of the IC body, and the circuit substrate includes a substrate including a recess formed by recessing a portion of a mounting surface of the substrate on which the IC is to be mounted, and a terminal protruding from the mounting surface of the substrate. The terminal is to be electrically connected to the solder bump.

6 Claims, 11 Drawing Sheets

(51) Int. Cl.
    *H01L 21/48*      (2006.01)
    *H01L 23/13*      (2006.01)
    *H01L 23/16*      (2006.01)
    *H01L 23/498*     (2006.01)
    *H01L 23/00*      (2006.01)
    *H05K 1/11*       (2006.01)
    *H05K 3/00*       (2006.01)
    *H05K 3/40*       (2006.01)
    *H05K 1/03*       (2006.01)
    *H05K 3/24*       (2006.01)
    *H05K 3/34*       (2006.01)

(52) U.S. Cl.
    CPC ............... *H01L 23/13* (2013.01); *H01L 23/16* (2013.01); *H01L 23/49816* (2013.01); *H01L 24/81* (2013.01); *H05K 1/111* (2013.01); *H05K 3/0014* (2013.01); *H05K 3/4007* (2013.01); *H05K 3/4697* (2013.01); *H01L 23/49827* (2013.01); *H01L 2224/16225* (2013.01); *H01L 2224/81136* (2013.01); *H01L 2224/81193* (2013.01); *H01L 2224/81801* (2013.01); *H01L 2924/01004* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01047* (2013.01); *H01L 2924/01056* (2013.01); *H01L 2924/14* (2013.01); *H01L 2924/1517* (2013.01); *H01L 2924/15151* (2013.01); *H01L 2924/15153* (2013.01); *H05K 1/0306* (2013.01); *H05K 3/245* (2013.01); *H05K 3/3436* (2013.01); *H05K 3/4061* (2013.01); *H05K 3/4611* (2013.01); *H05K 3/4629* (2013.01); *H05K 2201/0367* (2013.01); *H05K 2201/091* (2013.01); *H05K 2203/0278* (2013.01); *H05K 2203/308* (2013.01); *Y10T 29/4913* (2015.01); *Y10T 29/49139* (2015.01); *Y10T 29/49165* (2015.01); *Y10T 156/10* (2015.01); *Y10T 156/1052* (2015.01)

(56) References Cited

OTHER PUBLICATIONS

Fukuda; "Circuit Substrate, Circuit Module and Method for Manufacturing the Circuit Substrate"; U.S. Appl. No. 12/717,171, filed Mar. 4, 2010.

* cited by examiner

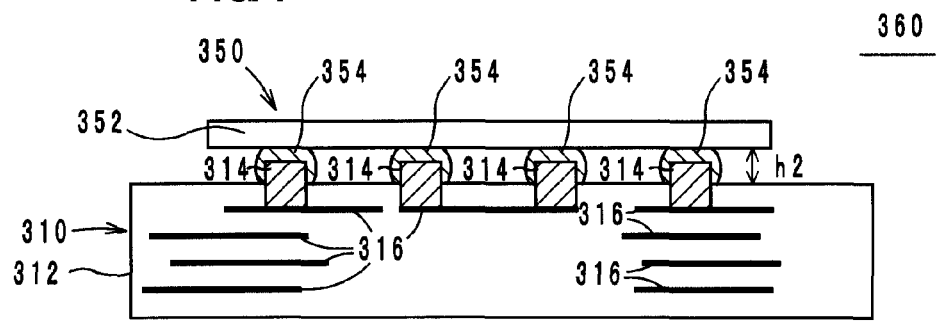
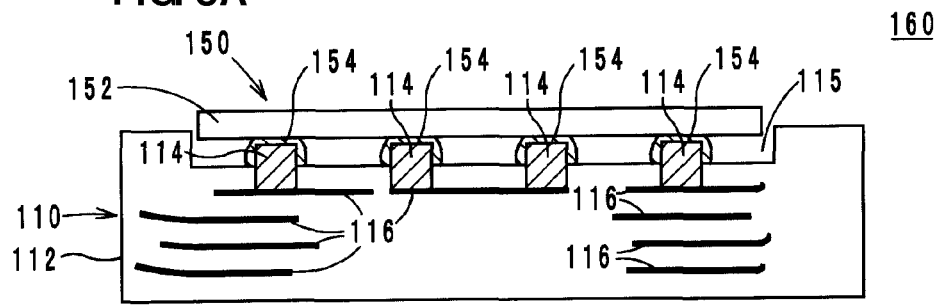
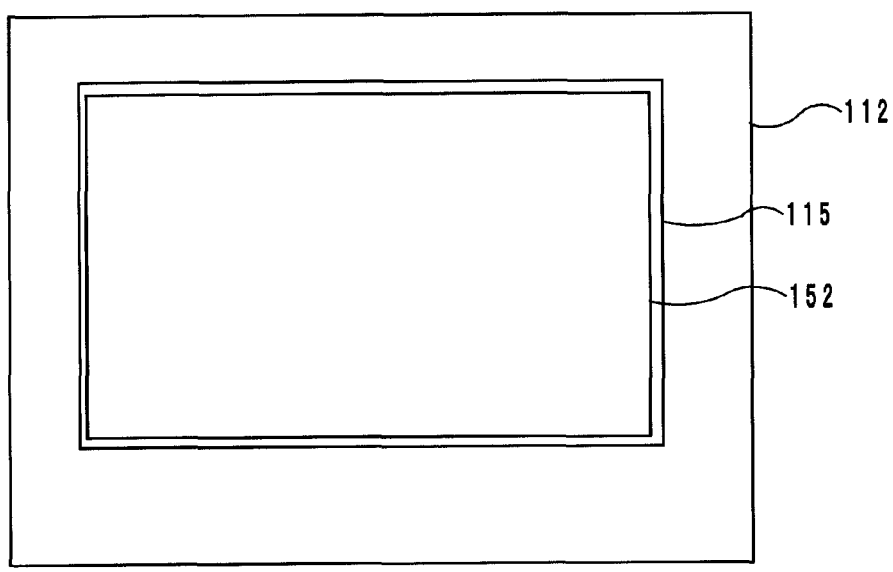

METHOD OF MANUFACTURING A CIRCUIT SUBSTRATE

BACKGROUND OF THE INVENTION

1. Field of the Invention

The present invention relates to a circuit substrate, a circuit module and a method for manufacturing the circuit substrate, and more specifically, to a circuit substrate on which electronic components are to be mounted, a circuit module and a method for manufacturing the circuit substrate.

2. Description of the Related Art

For mounting an electronic component, such as an IC, on a circuit substrate, the following technique is generally applied. Flat electrode pads are arranged in an array manner on the main surface of a circuit substrate. On the main surface of an IC, solder bumps are formed in an array manner. The IC is placed on the circuit substrate in such a manner that the solder bumps are aligned with the respective electrode pads, and the solder bumps are reflowed. The solder bumps are melted to fix the electrode pads, and the IC is thus mounted on the circuit substrate.

However, the circuit substrate and the IC have different thermal expansion coefficients. Consequently, for example, the circuit substrate may be warped by heat, and, thus, this mounting technique may result in connection failure between the circuit substrate and the IC. Accordingly, Japanese Patent No. 3203731 and Japanese Unexamined Patent Application Publication No. 2005-45143 disclose a semiconductor device substrate on which columnar bumps, but not flat electrode pads, are formed so as to protrude from the main surface thereof.

The columnar bump has a larger height than the electrode pad and is accordingly elastic. Even if the circuit substrate is warped by heat, the columnar bump can absorb the warping. Thus, the semiconductor device substrates disclosed in Japanese Patent No. 3203731 and Japanese Unexamined Patent Application Publication No. 2005-45143 can prevent the occurrence of connection failure between the circuit substrate and the IC.

Such a semiconductor device substrate however increases the height of the circuit substrate by the height of the columnar bumps.

SUMMARY OF THE INVENTION

Accordingly, preferred embodiments of the present invention provide a thin circuit substrate and circuit module that includes protruding terminals, and a method for manufacturing the circuit substrate.

A circuit substrate is provided on which a first electronic component having a bump is to be mounted. The circuit substrate includes a substrate including a mounting surface on which the first electronic component is to be disposed. The mounting surface includes a recess defined by a recessed portion of the mounting surface. The circuit substrate also includes a terminal to be electrically connected to the bump of the first electronic component. The terminal protrudes from the mounting surface within the recess. The circuit substrate may further include an electrode to which a second electronic component is to be joined. The electrode is disposed on the mounting surface outside the recess.

A circuit module is provided which includes a first electronic component, and a circuit substrate on which the first electronic component is mounted. The first electronic component includes an electronic component body and a bump located on the electronic component body. The circuit substrate includes a substrate including a mounting surface on which the first electronic component is disposed and including a recess defined by a recessed portion of the mounting surface, and a terminal electrically connected to the bump and protruding from the mounting surface within the recess.

According to a preferred embodiment of the present invention, the recess is formed preferably by recessing a portion of the mounting surface of the substrate. Consequently, the distance from the lower surface of the circuit substrate to the top of the terminal (that is, the height of the circuit substrate) can be smaller than the height of a semiconductor device substrate having a flat mounting surface. Thus, the thickness of a circuit substrate and a circuit module including the circuit substrate can be reduced.

The electronic component body may be disposed within the recess when viewed in the direction of the normal to the substrate.

Alternatively, the electronic component body may cover the recess beyond the edges of the recess when viewed in the direction of the normal to the substrate and be in contact with the substrate.

The circuit module may further include a second electronic component. In this instance, the circuit substrate further includes an electrode on the mounting surface outside the recess. The second electronic component is joined to the electrode with a solder layer therebetween.

According to another preferred embodiment of the present invention, a method of manufacturing a circuit substrate on which a first electronic component having a bump is to be mounted and the circuit substrate includes a terminal to which the bump of the first electronic component is to be electrically connected, includes the steps of forming a mask layer on a portion of a main surface of a first sheet, forming a through-hole in the mask layer, filling the through-hole with a conductive material, stacking a plurality of second sheets and the first sheet having the mask layer such that the mask layer acts as the uppermost layer, and compressing the stack to embed the mask layer in the first sheet, and removing the mask layer from the stack of the first sheet and the second sheets.

The mask layer may be formed by applying a resin paste onto the first sheet in the step of forming the mask layer.

The through-hole may be formed by irradiating the mask layer with a laser beam in the step of forming the through-hole.

In the method, the first sheet and the second sheets may be ceramic green sheets, and the mask layer may be made of a resin. In this instance, the step of removing the mask layer is performed by firing the first sheet and the second sheets together with the mask layer, thereby consuming the mask layer.

The through-hole may be formed so as to pass through the first sheet and the mask layer in the step of forming the through-hole.

The method may further include the steps of forming an electrode in a region other than the mask layer, and printing a solder paste on the electrode through a mask pattern. The electrode is to be joined to a second electronic component.

According to various preferred embodiments of the present invention, the recess is formed preferably by recessing a portion of the mounting surface of the substrate, and a terminal is formed within the recess. Consequently, the height of the circuit substrate can be lower than the height of a semiconductor device substrate having a flat mounting surface. Thus, the thickness of a circuit substrate and a circuit module including the circuit substrate can be reduced.

Other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a sectional view of the structure of a circuit module according to a comparative example.

FIG. 8A is a sectional view of the structure of a circuit module including an IC and a circuit substrate according to a second preferred embodiment of the present invention, and FIG. 8B is a plan view of the circuit module.

DETAILED DESCRIPTION OF THE PREFERRED EMBODIMENTS

Figure 1:
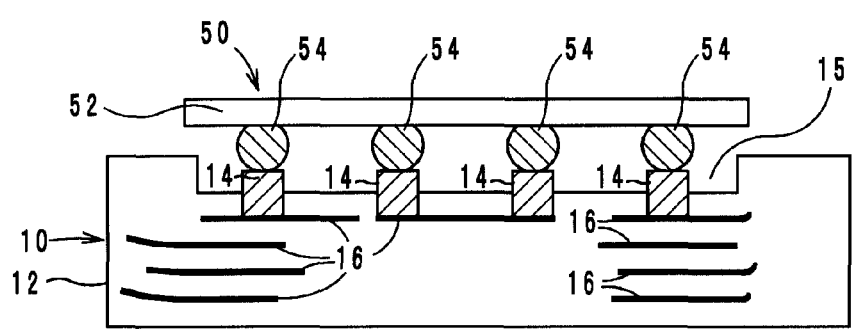
FIG. 1 is a sectional view of a structure in which an IC is aligned on a circuit substrate according to a first preferred embodiment of the present invention.
Figure 2A:
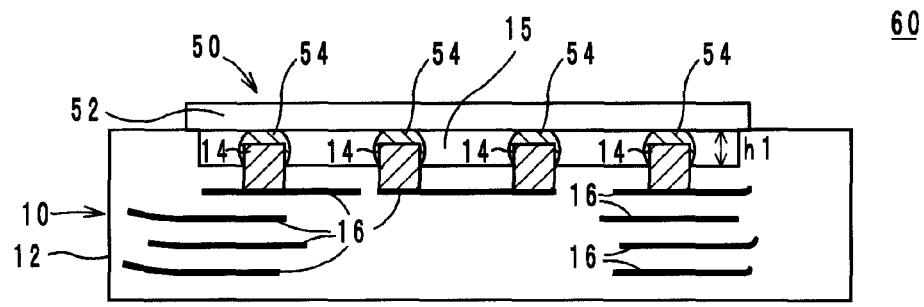
FIG. 2A is a sectional view of the structure of a circuit module including an IC and a circuit substrate.
Figure 2B:
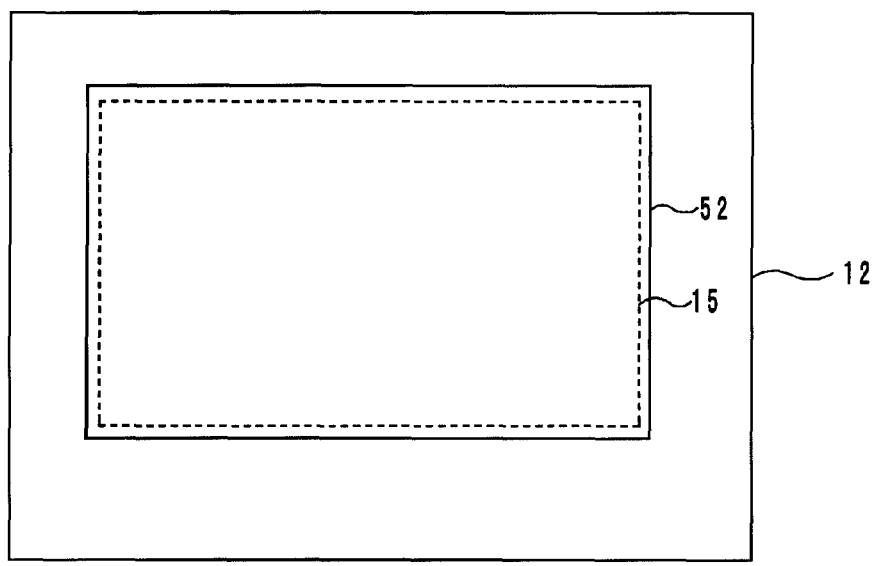
FIG. 2B is a plan view of the circuit module.

The structures of a circuit substrate and a circuit module according to a first preferred embodiment will now be described with reference to related drawings. FIG. 1 is a sectional view of the structure in which a semiconductor integrated circuit (hereinafter referred to as IC) 50 is aligned on a circuit substrate 10. FIG. 2A is a sectional view of the structure of a circuit module 60 including the IC 50 and the circuit substrate 10. FIG. 2B is a plan view of the circuit module 60. The plan view mentioned herein refers to a structure viewed in the direction of the normal to the circuit module 60.

The circuit substrate 10 is a base on which an electronic component, or the IC 50, is to be surface-mounted, and includes a substrate 12, terminals 14 and internal conductive layers 16, as shown in FIG. 1. The substrate 12 includes a stack of a plurality of insulating ceramic layers. The substrate 12 includes a recess 15 formed by recessing a portion of the mounting surface thereof on which the IC 50 is to be mounted. In the description hereinafter, the upper surface of the substrate 12 is referred to as the mounting surface, and the surface of the substrate 12 opposing the mounting surface is referred to as the lower surface. In the present preferred embodiment, the mounting surface refers to the visible surface in plan view. More specifically, the mounting surface includes the surface defined by the region outside the recess 15 and the surface defined by the region within the recess 15. The term recessing indicates that a portion of the circuit substrate 10 is deformed by compression.

The internal conductive layers 16 are stacked with the ceramic layers to form the substrate 12. The internal conductive layers 16 are connected to each other through via conductors (not shown) to form a circuit.

The terminals 14 are formed in an array manner in the recess 15 so as to protrude from the mounting surface of the substrate 12, and serve to electrically connect the circuit including the internal conductive layers 16 with the IC 50. Hence, first ends of the terminals 14 are electrically connected to the internal conductive layers 16. The level of the terminal is lower than the level of the mounting surface of the substrate 12 outside the recess 15.

The IC 50 includes an IC body 52 and solder bumps 54. The IC body 52 includes a silicon substrate having a circuit (not shown). The solder bumps 54 are arranged in an array on the lower surface of the IC body 52, and serve to electrically connect the circuit of the IC body 52 with the terminals 14. In the description hereinafter, the upper surface of the IC body 52 is referred to as the upper surface, and the lower surface of the IC body 52 is referred to as the mounting surface.

The circuit substrate 10 and the IC 50 are aligned such that the terminals 14 come in contact with the respective solder bumps 54, as shown in FIG. 1, and are then reflowed. The solder bumps 54 are thus melted to cover the terminals 14, as shown in FIG. 2A. Consequently, the IC 50 is mounted on the circuit substrate 10.

The area of the recess 15 in plan view is smaller than that of the IC body 52. Hence, the IC body 52 is mounted so as to cover the recess 15 beyond the edges of the recess 15 when the circuit module 60 is viewed from above, as shown in FIG. 2B. In this instance, the mounting surface of the IC body 52 is in contact with the mounting surface of the substrate 12, as shown in FIG. 2A.

A method for manufacturing the circuit substrate 10 will now be described with reference to related drawings. FIGS. 3A to 6 are sectional views of the circuit substrate 10 in a manufacturing process.

First, a binder, a plasticizer and a solvent are mixed to a ceramic material powder containing barium oxide, silicon oxide and alumina to prepare a slurry. Subsequently, the slurry is formed into a sheet on a carrier film to prepare a ceramic green sheet by a doctor blade method or any other sheet forming technique. The ceramic green sheet is cut into pieces having a predetermined size.

Figure 3A:
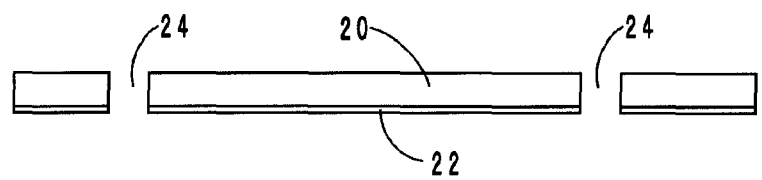
FIGS. 3A-3C are sectional views showing a manufacturing process of a circuit substrate.
Figure 3B:
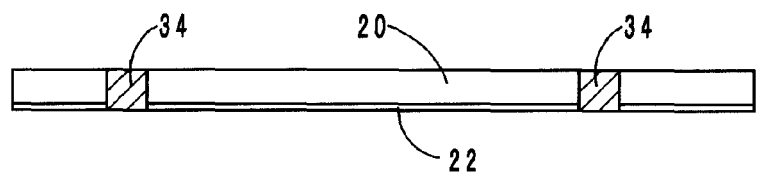

After the completion of the ceramic green sheets, layers constituting the substrate 12 are formed. As shown in FIG. 3A, first, through-holes 24 are formed in one of the ceramic green sheets 20 by stamping. Then, the through-holes 24 are filled with a conductive paste mainly containing a conductive material, such as Cu or Ag, to form via conductors 34, as shown in FIG. 3B.

Figure 3C:
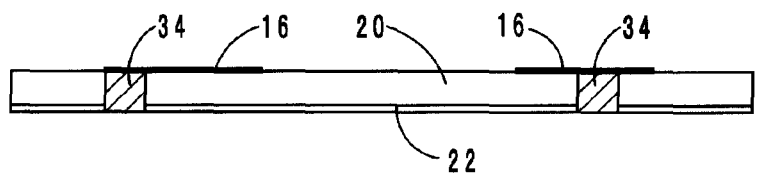

Subsequently, a conductive paste mainly containing a conductive material, such as Cu or Ag, is printed on the main surface of the ceramic green sheet 20 to form an internal conductive layer 16 having a predetermined pattern. One of the layers constituting the substrate 12 is thus completed through the steps shown in FIGS. 3A to 3C. The series of the steps shown in FIGS. 3A to 3C is repeated until all the layers constituting the substrate are completed.

Figure 4A:
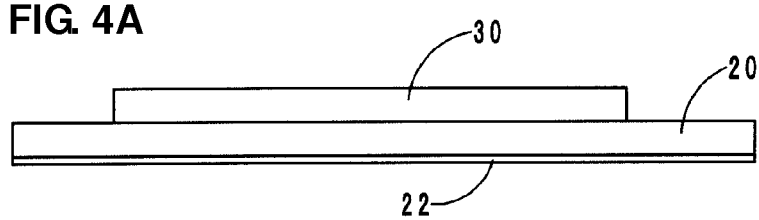
FIGS. 4A-4C are sectional views showing the manufacturing process of a circuit substrate.

Then, the uppermost layer of the substrate 12 is formed using one of the ceramic green sheets. More specifically, a resin paste mainly containing polypropylene, butyral or acrylic resin, for example, is screen-printed on a portion of the main surface of the ceramic green sheet 20 to form a mask layer 30, as shown in FIG. 4A.

Figure 4B:
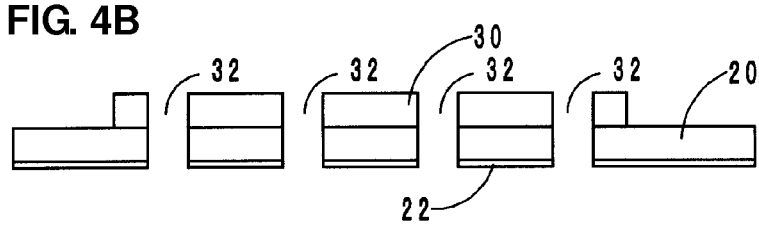
Figure 4C:
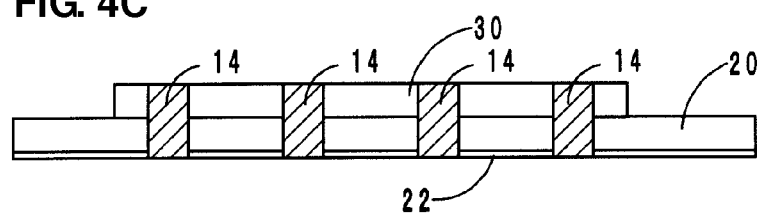

After the formation of the mask layer 30, the ceramic green sheet 20 and the mask layer 30 are subjected to stamping together to form through-holes 32 passing through the ceramic green sheet 20 and the mask layer 30, as shown in FIG. 4B. Then, the through-holes 32 are filled with a conductive paste mainly containing a conductive material, such as Cu or Ag, to form terminals 14, as shown in FIG. 4C.

Figure 5A:
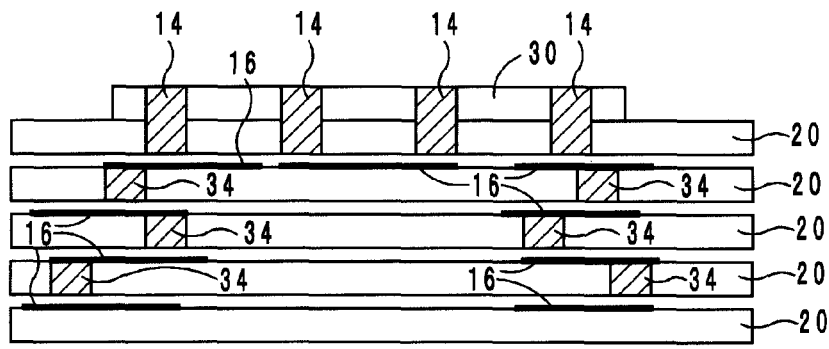
FIGS. 5A and 5B are sectional views showing the manufacturing process of a circuit substrate.

Turning now to FIG. 5A, the mask layer 30 and a plurality of ceramic green sheets 20 are stacked in such a manner that the mask layer 30 overlies the ceramic green sheets 20 so as to act as the uppermost layer. In practice, a carrier film 22 is removed from each ceramic green sheet 20 before stacking the layers. Thus, a multilayer green composite 40 is completed.

Figure 5B:
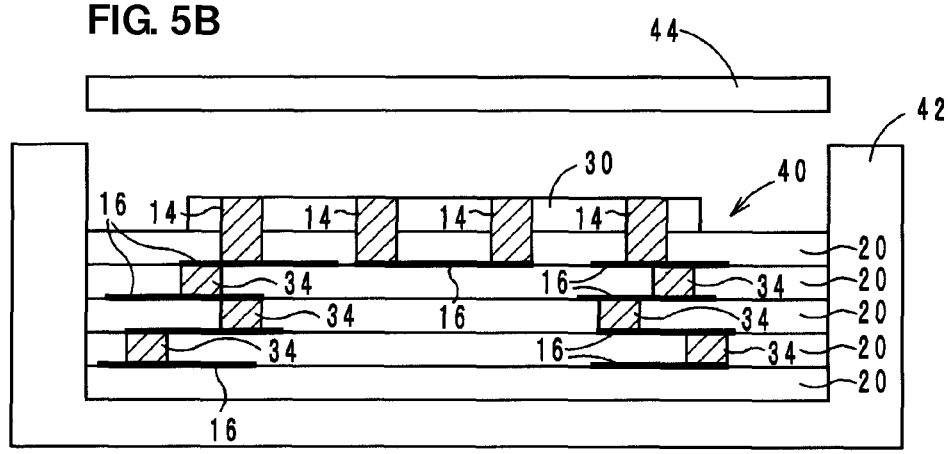
Figure 6:
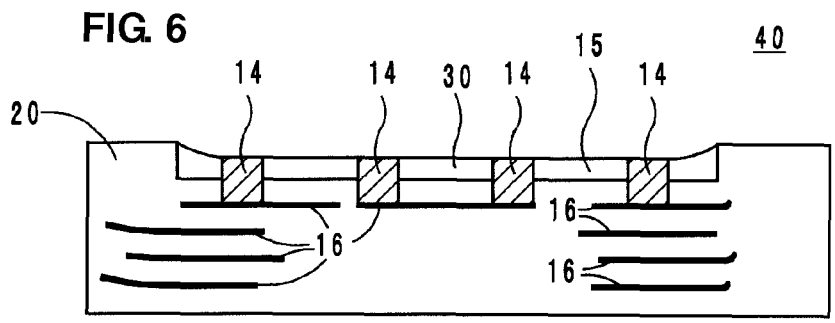
FIG. 6 is a sectional view showing the manufacturing process of a circuit substrate.

Subsequently, the multilayer green composite 40 is placed in a base mold 42, and the multilayer green composite 40 is compressed by applying a pressure using a mold cover 44 from above to bind the ceramic green sheets 20 and the mask layer 30 together, as shown in FIG. 5B. The compression is preferably performed under conditions of a mold cover 44 temperature of about 70° C. and a mold cover 44 pressure of about 400 kg/cm$^2$, for example. Thus, the ceramic green sheets 20 under the mask layer 30 is compressed by the mask layer 30 in the thickness direction, so that the mask layer 30 is embedded in the uppermost ceramic green sheet 20, as shown in FIG. 6. Thus, the recess 15 is formed. At this time, the internal conductive layers 16 are bent in such a manner that the portions of the internal conductive layers 16 under the mask layer 30 sink downwards, as shown in FIG. 6. In FIG. 6, the boundaries between the ceramic green sheets 20, and the via conductors 34 are omitted.

Finally, the multilayer green composite 40 including the ceramic green sheets 20 is fired. At this time, the mask layer 30 is consumed (burned down) due to high temperature, and the recess 15 appears. The firing is performed at 990° C. for 1 hour. The circuit substrate 10 as shown in FIG. 1 is thus completed through the above-described process.

The circuit substrate 10 includes a recess 15 formed by recessing a portion of the mounting surface of the substrate 12, and terminals 14 are formed in the recess 15. Consequently, the distance from the lower surface of the circuit substrate 10 to the top of the terminal 14 (that is, the height of the circuit substrate) can be smaller than the height of a semiconductor device substrate having a flat mounting surface as disclosed in Japanese Patent No. 3203731. Thus, the thicknesses of the circuit substrate 10 and the circuit module 60 can be reduced. This will be described in detail below.

The semiconductor device substrate disclosed in Japanese Patent No. 3203731 has columnar bumps protruding from the substrate, and a bump-forming sheet corresponding to the mask layer 30 is disposed as the uppermost layer over the entire surface of the substrate. Accordingly, a force is substantially evenly placed on the mounting surface of the substrate for compression, and a recess is not formed in the mounting surface of the substrate.

On the other hand, for forming the circuit substrate 10, the portions of the ceramic green sheets 20 under the mask layer receive a higher pressure for compression than the other portions of the ceramic green sheets 20. Consequently, the compression in the stacking direction of the portions of the ceramic green sheets 20 under the mask layer 30 becomes larger by the thickness of the mask layer 30 than that of the other portions of the ceramic green sheets 20 and that of the substrate of Japanese Patent No. 3203731. Thus, the height of the circuit substrate 10 is more reduced by the thickness of the mask layer 30 than that of the semiconductor device substrate. Hence, the thicknesses of the circuit substrate 10 and the circuit module 60 including the circuit substrate 10 can be reduced.

Since the recess 15 is smaller than the IC body 52 when viewed from above, as shown in FIG. 2B, the mounting surface of the IC body 52 comes in contact with the mounting surface of the substrate 12 when the IC 50 is mounted on the circuit substrate 10. Consequently, the substrate 12 and the IC body 52 can maintain a distance to some extent therebetween so as to prevent the solder bumps 54 from being excessively compressed to cause a short circuit between adjacent solder bumps 54. The reason will be described below with reference to FIGS. 2A and 7. FIG. 7 is a sectional view of the structure of a circuit module 360 according to a comparative example. Let the distance between the mounting surface of the substrate 12 and the mounting surface of the IC body 52 be h1 in FIG. 2A. Also, in FIG. 7, let the distance between the mounting surface of the substrate 312 and the mounting surface of the IC body 352 be h2.

In the circuit module 360 shown in FIG. 7, an IC 350 is mounted on a circuit substrate 310 whose mounting surface does not have a recess. In this instance, since the mounting surface of the IC body 352 does not come in contact with the mounting surface of the substrate 312, the terminals 314 can be inserted in the solder bumps 354 to a larger depth than those of the circuit module 60 shown in FIGS. 2A and 2B. Accordingly, the distance h2 between the mounting surface of the substrate 312 and the mounting surface of the IC body 352 is smaller than the distance h1 between the substrate 12 and the IC body 52.

If the solder bump 54 and the solder bump 354 have the same volume before mounting, the volume of the terminal 14 embedded in the solder bump 54 in the circuit module 60 shown in FIGS. 2A and 2B is smaller than that in the circuit module 360 shown in FIG. 7. Accordingly, the form of the solder bump 54 of the circuit module 60 shown in FIGS. 2A and 2B becomes smaller than that of the solder bump 354 of the circuit module 360 shown in FIG. 7. Consequently, the distances between the solder bumps in the circuit module 60 become larger than those in the circuit module 360, thus preventing short-circuiting.

For the circuit module 60, the through-holes 32 are formed in the ceramic green sheet 20 and the mask layer 30 at one time in the step shown in FIG. 4B. This can prevent the misalignment between the through-holes 32 formed in the ceramic green sheet 20 and the through-holes 32 formed in the mask layer 30. This will be further described below.

If the mask layer 30 is formed of, for example, a resin sheet, but not of a resin paste, the through-holes 32 of the mask layer 30 and the through-holes 32 of the ceramic green sheet 20 are formed in different steps. In this instance, the through-holes 32 are formed in the ceramic green sheet 20 and the mask layer 30 separately, and then the mask layer 30 is disposed on the ceramic green sheet 20. Therefore, the through-holes 32 of the ceramic green sheet 20 and the through-holes 32 of the mask layer 30 can be misaligned unless the mask layer 30 is disposed on the ceramic green sheet 20 with precise alignment. For the circuit module 60, on the other hand, the through-holes 32 are formed in the ceramic green sheet 20 and the mask layer 30 at one time, thus preventing misalignment of the through-holes 32.

The structures of a circuit substrate and a circuit module according to a second preferred embodiment will now be described with reference to related drawings. FIG. 8A is a sectional view of the structure of a circuit module 160 including an IC 150 and a circuit substrate 110. FIG. 8B is a plan view of the circuit module 160. In the following description, differences of the circuit module 160 from the circuit module 60 of the first preferred embodiment will be mainly described.

In the circuit module 160, the area of the recess 115 in plan view is larger than that of the IC body 152. Accordingly, the IC body 152 is disposed within the recess 115 when the circuit module 160 is viewed from above, as shown in FIG. 8B. In this state, the level of the mounting surface of the IC body 152 is lower than the level of the mounting surface of the substrate 112 outside the region of the recess 115, as shown in FIG. 8A.

Thus, the distance from the lower surface of the substrate 112 to the upper surface of the IC body 152 (that is, the height of the circuit module 160) is shorter than the distance from the lower surface of the substrate 12 to the upper surface of the IC body (that is, the height of the circuit module 60). Hence, the thickness of the circuit module 160 can be more reduced than that of the circuit module 60. It is preferable that the circuit module 160 be designed to have such a height as can maintain distances between the solder bumps 154 so as to prevent short-circuiting.

Figure 9:
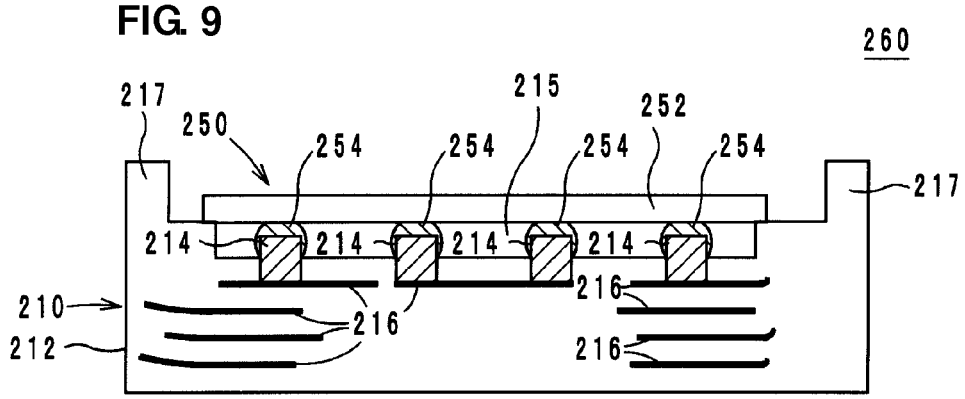
FIG. 9 is a sectional view of the structure of a circuit module including an IC and a circuit substrate according to a third preferred embodiment of the present invention.

The structures of a circuit substrate and a circuit module according to a third preferred embodiment will now be described with reference to related drawings. FIG. 9 is a sectional view of the structure of a circuit module 260 including an IC 250 and a circuit substrate 210. In the following description, differences of the circuit module 260 from the circuit module 60 of the first preferred embodiment will be mainly described.

The circuit substrate 210 includes a substrate 212 and a frame portion 217 rising from the mounting surface along the sides of the mounting surface. The frame portion 217 loops so as to surround the mounting surface of the substrate 212. Also, the frame portion 217 is formed such that the level of the upper surface thereof is higher than that of the upper surface of the IC body 252. This structure allows the IC 250 to be sealed by filling the region surrounded by the frame portion 217 with a resin. In the present preferred embodiment, the mounting surface of the substrate 212 refers to the region surrounded by the frame portion 217, not including the upper surface of the frame portion 217.

The upper surface of the frame portion 217 lies at a level higher than the upper surface of the IC body 252. The structure of the circuit substrate 210 allows the distance from the lower surface of the substrate 212 to the upper surface of the IC body 252 to be reduced, as in the circuit substrate 10. Consequently, the level of the upper surface of the frame portion 217 can be lowered by the degree in which the level of the IC body 252 lowers. In the circuit module 260, the distance from the lower surface of the substrate 212 to the upper surface of the frame portion 217 (that is, the height of the circuit module 260) can thus be reduced. Hence, the thicknesses of the circuit substrate 210 and the circuit module 260 can be reduced.

Figure 10A:
FIG. 10A is a sectional view of the structure of a ceramic green sheet.
Figure 10B:
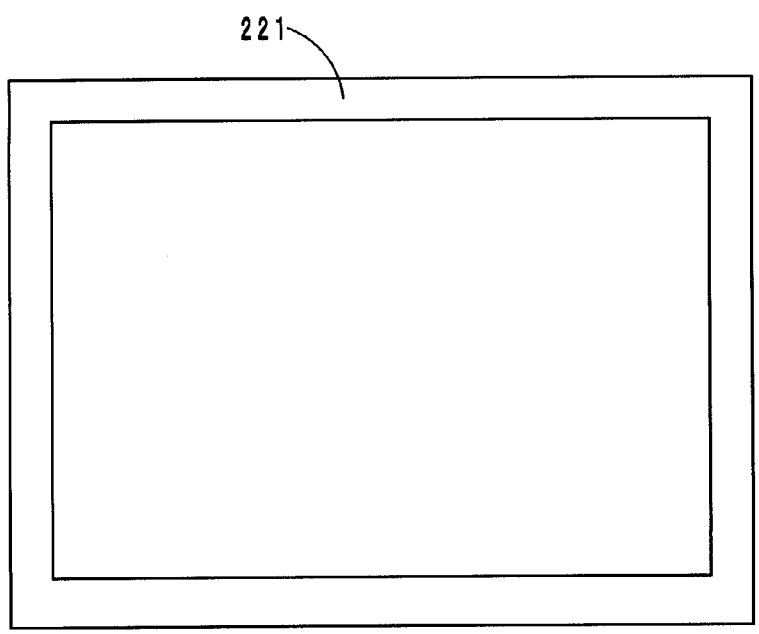
FIG. 10B is a plan view of the ceramic green sheet.
Figure 11:
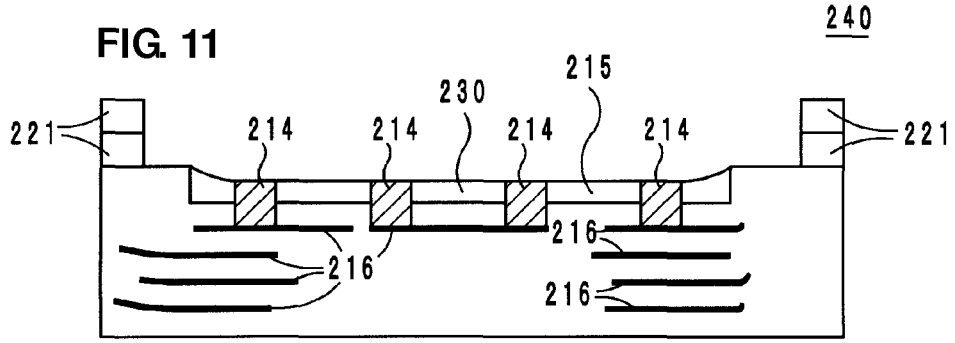
FIG. 11 is a sectional view showing a manufacturing process of a circuit substrate.

The circuit substrate 210 can be manufactured by the following method. A method for manufacturing the circuit substrate 210 will now be described with reference to FIGS. 10A, 10B and 11. FIG. 10A is a sectional view of a ceramic green sheet 221. FIG. 10B is a plan view of the ceramic green sheet 221. FIG. 11 is a sectional view showing a step of the manufacturing process of the circuit substrate 210.

The ceramic green sheet 221 defines the frame portion 217, and has such a shape as is formed by stamping the center of a rectangular sheet, as shown in FIG. 10B. A carrier film 222 is bonded to the rear surface of the ceramic green sheet 221. The ceramic green sheet 221 is disposed on the multilayer green composite 40 shown in FIG. 6 after the carrier has been removed therefrom, and then compression bonding is performed. The compression bonding is performed at a pressure of about 200 kg/cm$^2$, for example. The resulting composite is referred to as a multilayer green composite 240. The multilayer green composite 240 includes two ceramic green sheets 221.

Subsequently, the multilayer green composite 240 is fired in the same manner as in the method of the circuit substrate 10 according to the first preferred embodiment. In this step, the mask layer 230 is burned down and removed due to high temperature and the recess 215 appears. The circuit substrate 210 as shown in FIG. 9 is thus completed through the above-described process.

Figure 12:
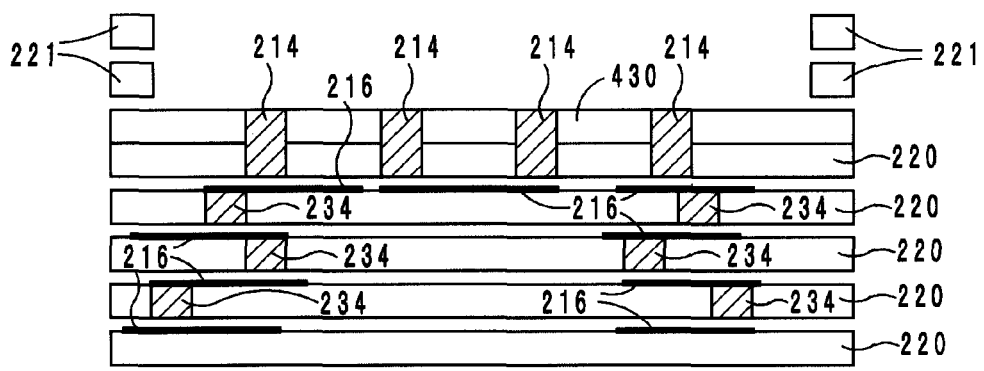
FIG. 12 is a sectional view showing a manufacturing process of a circuit substrate according to a comparative example.
Figure 13:
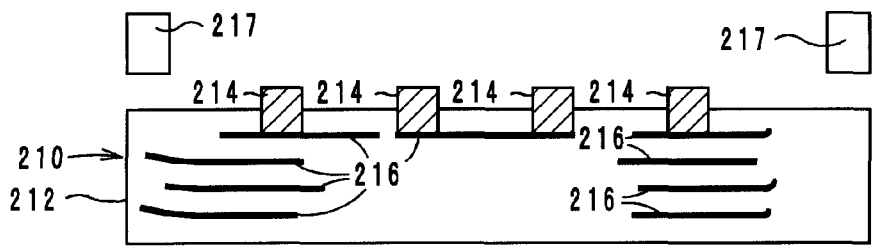
FIG. 13 is a sectional view showing a manufacturing process of a circuit substrate according to a comparative example.

The above-described method of the present preferred embodiment can provide a circuit substrate 210 including the frame portion 217. The detail will be described below with reference to FIGS. 12 and 13. FIGS. 12 and 13 are sectional views showing steps of a manufacturing process of the circuit substrate 210 according to a comparative example. In the process according to the comparative example, a mask layer 430 is formed of a resin sheet, but not a resin paste. This process will be described in detail below.

In the method according to the comparative example, the mask layer is formed so as to cover the entire surface of the uppermost ceramic green sheet 220, as shown in FIG. 12. Then, additional ceramic green sheets 221 intended for the frame portion 217 are disposed on the mask layer 430. The ceramic green sheets 220, the ceramic green sheets 221 and the mask layer 430 are compressed together, thereby forming a multilayer green composite. The multilayer green composite is fired. In this step, the mask layer 430 is burned down and removed due to high temperature. The ceramic green sheets 221 disposed on the mask layer 430 as shown in FIG. 12 are separated from the substrate 212, as shown in FIG. 13, by removing the mask layer 430. Hence, the circuit substrate manufacturing method using the resin sheet cannot produce the circuit substrate 210.

In the circuit substrate manufacturing method according to the third preferred embodiment, on the other hand, the mask layer 230 is formed of a resin paste on a portion of the upper surface of the ceramic green sheet 220. Thus, the mask layer 230 is not present between the ceramic green sheet 220 and the ceramic green sheets 221. Consequently, the frame portion 217 is not separated from the substrate 212.

Figure 14:
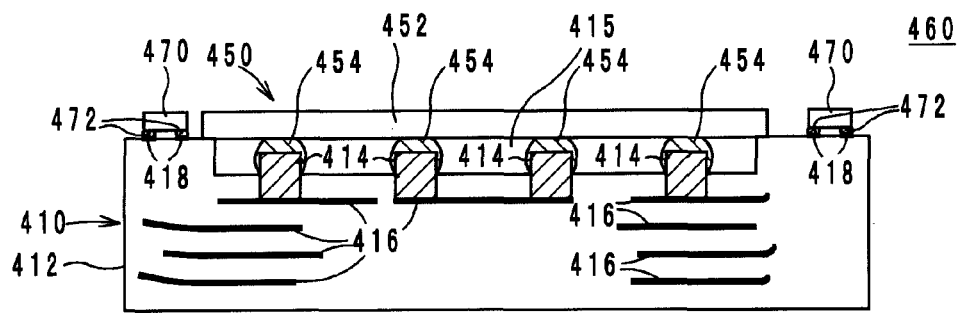
FIG. 14 is a sectional view of the structure of a circuit module including an IC and a circuit substrate according to a fourth preferred embodiment of the present invention.

The structures of a circuit substrate and a circuit module according to a fourth preferred embodiment will now be described with reference to related drawings. FIG. 14 is a sectional view of the structure of a circuit module 460 including an IC 450 and a circuit substrate 410. In the following description, differences of the circuit module 460 from the circuit module 60 of the second preferred embodiment will be mainly described.

The difference between the circuit module 60 and the circuit module 460 is that the circuit module 460 includes a circuit substrate 410 including an IC 450 and an electronic component 470 while the circuit module 60 includes a circuit substrate 10 including only the IC 50. More specifically, the substrate 412 includes land electrodes 418 used for mounting an electronic component 470 on the mounting surface outside the recess 415. The electronic component 470 is disposed on the land electrodes 418 with a solder layer 472 therebetween.

Figure 15:
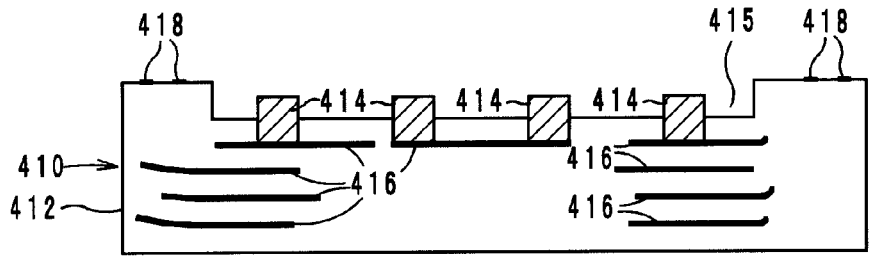
FIG. 15 is a sectional view of a circuit module in a manufacturing process.
Figure 16:
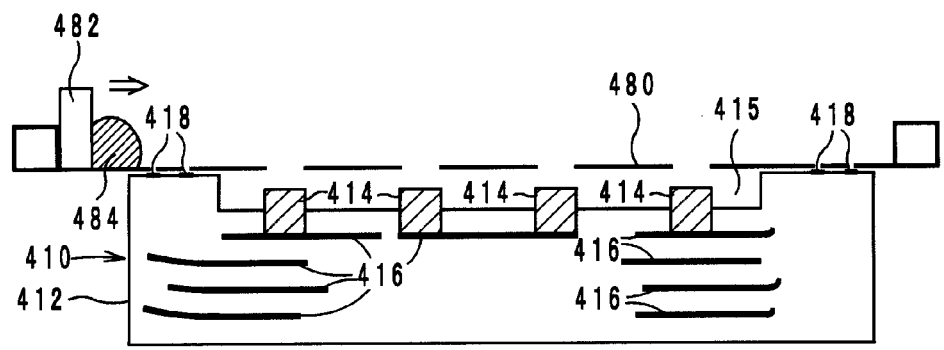
FIG. 16 is a sectional view of a circuit module in a manufacturing process.
Figure 17:
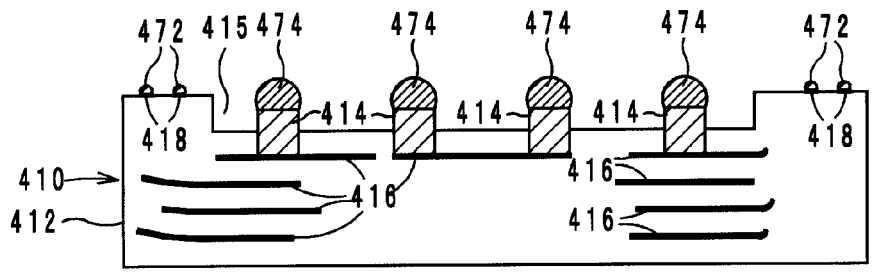
FIG. 17 is a sectional view of a circuit module in a manufacturing process.

A method for manufacturing the circuit module 460 will now be described with reference to related drawings. FIGS. 15 to 17 are sectional views of the circuit module 460 in steps of the manufacturing process.

First, the steps shown in FIGS. 3A to 6 are performed in the same manner as in the manufacturing process of the circuit substrate 10 according to the first preferred embodiment, and the same description will be omitted. Subsequently, land electrodes 418 are formed on the mounting surface outside the recess 415, as shown in FIG. 15. The land electrodes 418 are formed by, for example, applying an electroconductive paste mainly containing Cu, followed by firing. The firing of the land electrodes 418 may be performed simultaneously with the firing of the multilayer composite.

Turning now to FIG. 16, a metal mask 480 including openings corresponding to the terminals 414 and the land electrodes 418 is aligned on the circuit substrate 410. Then, a squeegee 482 is moved on the metal mask 480 in the arrow direction to print a solder paste 484 through the metal mask 480. Thus, solder layers 472 and 474 are printed on the terminals 414 and the land electrode 418, as shown in FIG. 17. Subsequently, an electronic component 470 and an IC 450 are mounted to complete the circuit module 460 shown in FIG. 14.

Figure 18:
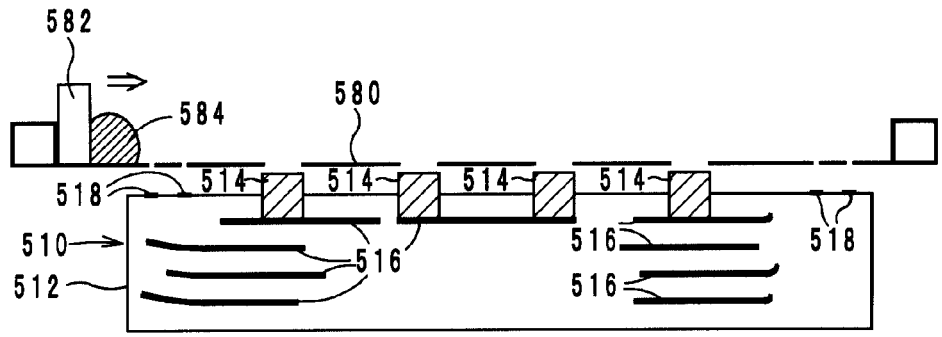
FIG. 18 is a sectional view of the structure of a circuit substrate according to a comparative example.

The circuit substrate 410 of the present preferred embodiment can prevent the terminals 414 from breaking, and prevent the solder layers 472 from being displaced and undesirably spreading, as described below with reference to related drawings. FIG. 18 is a sectional view of the structure of a circuit substrate 510 according to a comparative example.

The circuit substrate 510 shown in FIG. 18 is different from the circuit substrate 410 shown in FIG. 14 in that the recess 415 is not formed. In order to print solder layers on the terminals 514 and the land electrodes 518 of such a circuit substrate 510, the metal mask 580 is disposed on the circuit substrate 510, and a solder paste 584 is printed using a squeegee 582.

In order to prevent the solder layers from being displaced when the solder paste 584 is printed, the metal mask 580 should be disposed close to the mounting surface of the substrate 510. However, the circuit substrate 510 shown in FIG. 18 includes terminals 514 protruding upward from the mounting surface of the substrate 512. If the metal mask 580 is disposed excessively close to the circuit substrate 510 to prevent the solder layers from being displaced or undesirably spreading, the squeegee 582 may come in contact with the terminals 514 to break the terminals 514. On the other hand, if the metal mask 580 is disposed excessively distant from the mounting surface of the circuit substrate 510 to prevent the terminals 514 from being broken, the printed solder layers are displaced or undesirably spread because of the large distance between the metal mask 580 and the terminals 514 and land electrodes 518.

On the other hand, in the circuit substrate 410 including the recess 415, the terminals 414 are formed within the recess 415. Consequently, the possibility that the squeegee 582 comes into contact with the land electrodes 418 is low even though the metal mask 480 is disposed close to the land electrodes 418. In addition, the distance between the land electrodes 418 and the metal mask 480 in the circuit substrate 410 can be more reduced than that in the circuit substrate 510, as shown in FIGS. 16 and 18. Accordingly, the displacement and undesired spread of the printed solder layer 472 can be prevented particularly on the land electrodes 418.

The circuit substrate 410 and the circuit module 460 according to the fourth preferred embodiment may be produced by the following manufacturing method. FIGS. 19 to 22 are sectional views of the circuit module 460 in steps of the manufacturing process.

First, the steps shown in FIGS. 3A to 6 are performed in the same manner as in the manufacturing process of the circuit substrate 10 of the first preferred embodiment, and the same description will be omitted. Subsequently, land electrodes 418 are formed on the mounting surface outside the recess 415, as shown in FIG. 15. The land electrodes 418 are formed by, for example, applying an electroconductive paste mainly containing Cu, followed by firing. The firing of the land electrodes 418 may be performed simultaneously with the firing of the multilayer composite.

Figure 19:
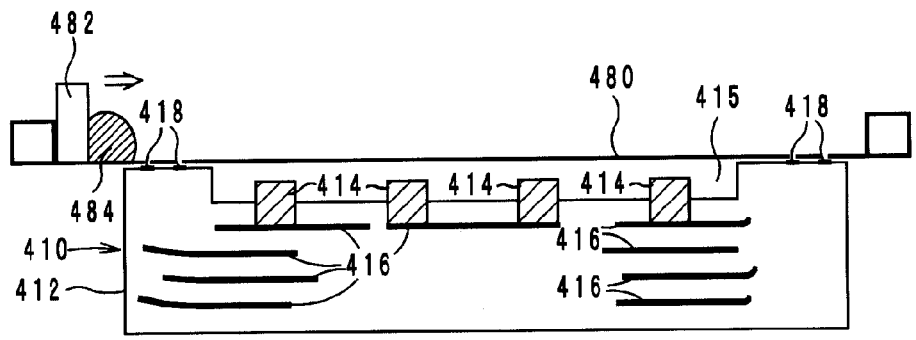
FIG. 19 is a sectional view of a circuit module in a manufacturing process.
Figure 20:
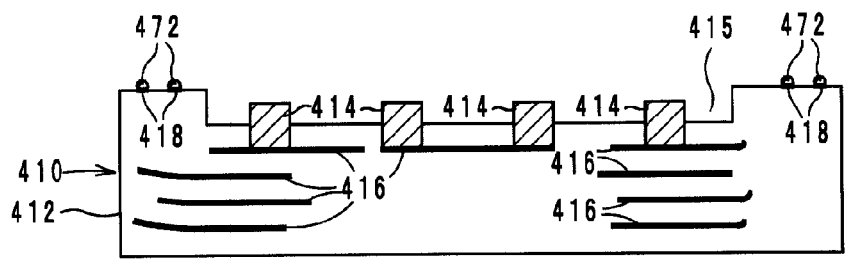
FIG. 20 is a sectional view of a circuit module in a manufacturing process.

Turning now to FIG. 19, a metal mask 480 having openings corresponding to the land electrodes 418 is aligned on the circuit substrate 410. This metal mask 480 does not have openings corresponding to the terminals 414. Then, a squeegee 482 is moved on the metal mask 480 in the arrow direction to print a solder paste 484 through the metal mask 480. Thus, solder layers 472 are printed on the land electrodes 418, as shown in FIG. 20.

Figure 21:
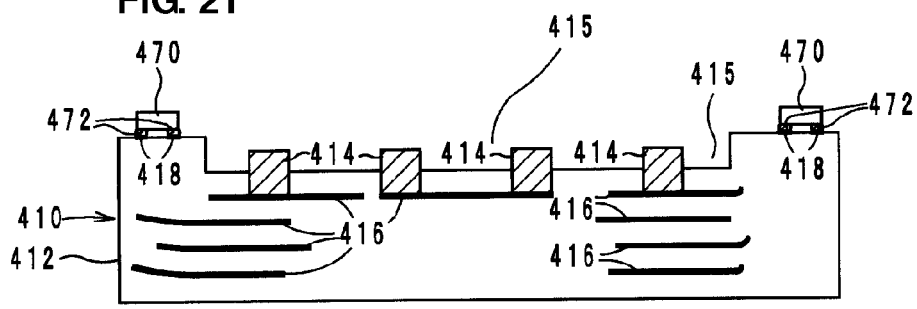
FIG. 21 is a sectional view of a circuit module in a manufacturing process.
Figure 22:
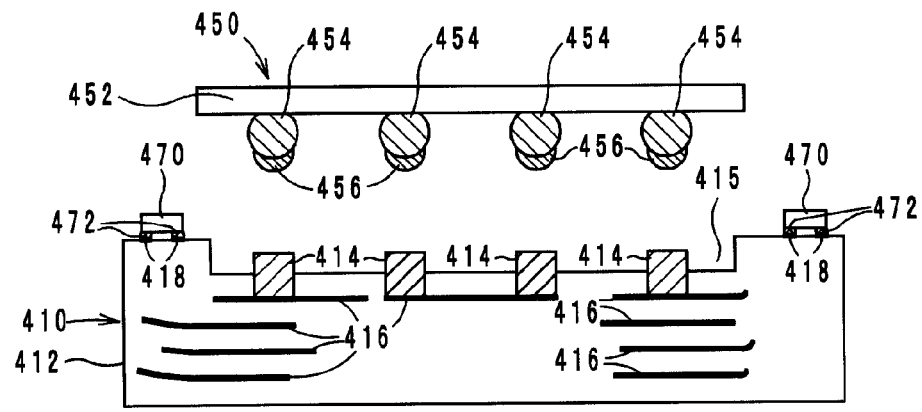
FIG. 22 is a sectional view of a circuit module in a manufacturing process.

Subsequently, an electronic component 470 is mounted on the land electrodes 418 with the solder layers 472 therebetween, as shown in FIG. 21. Then, an IC 450 having solder bumps 454 coated with a flux 456 is disposed on the terminals 414, as shown in FIG. 22. The reflowing temperature for mounting the electronic component 470 and the IC 450 is, for example, about 260° C. The circuit module 460 is thus completed through the above-described process.

Figure 23:
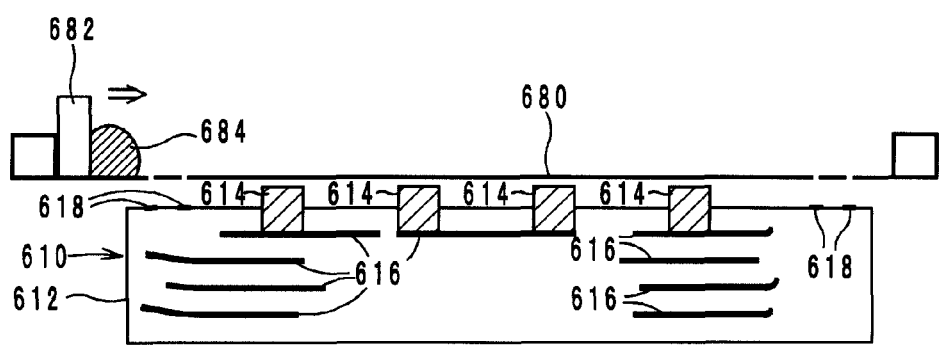
FIG. 23 is a sectional view of the structure of a circuit substrate according to a comparative example.

The circuit substrate 410 of the present preferred embodiment can prevent the top ends of the terminals 414 from being crushed, and prevent the solder layers 472 from being displaced and undesirably spreading, as described below with reference to related drawing. FIG. 23 is a sectional view of the structure of a circuit substrate 610 according to a comparative example.

The circuit substrate 610 shown in FIG. 23 is different from the circuit substrate 410 shown in FIG. 14 in that the recess 415 is not formed. In order to print solder layers on the terminals 614 and the land electrodes 618 of such a circuit substrate 610, the metal mask 680 is disposed on the circuit substrate 610, and a solder paste 684 is printed using a squeegee 682.

In order to prevent the solder layers from being displaced when the solder paste 684 is printed, the metal mask 680 should be disposed close to the mounting surface of the substrate 610. However, the circuit substrate 610 shown in FIG. 23 has terminals 612 protruding upward from the mounting surface of the substrate 614. If the metal mask 680 is disposed excessively close to the circuit substrate 610 to prevent the solder layers from being displaced or undesirably spreading, the metal mask 680 may be pressed on the terminals 614 to crush the top ends of the terminals 614. On the other hand, if the metal mask 680 is disposed excessively distant from the mounting surface of the circuit substrate 610 to prevent the terminals 614 from being crushed, the solder layers are displaced or undesirably spread because of the large distance between the metal mask 680 and the terminals 614 and land electrodes 618.

On the other hand, in the circuit substrate 410 having the recess 415, the terminals 414 are formed within the recess 415. Consequently, the possibility that the metal mask 480 comes into contact with the land electrodes 418 is low even though the metal mask 480 is disposed close to the land electrodes 418. In addition, the distance between the land electrodes 418 and the metal mask 480 in the circuit substrate 410 can be more reduced than that in the circuit substrate 610, as shown in FIGS. 19 and 23. Accordingly, the displacement and undesired spread of the printed solder layer 472 can be prevented particularly on the land electrodes 418.

The solder bumps 454 may be coated with a solder paste instead of the flux 456.

Although the through-holes 24 and 32 in the circuit substrate 10 are preferably formed by stamping, for example, other techniques may be applied to form the through-holes 24 and 32. For example, the through-holes 24 and 32 may be formed by laser beam machining. If the through-holes 32 are formed by laser beam machining, it is preferable that laser beam be irradiated from the mask layer 30 side. Since the energy of laser beam is consumed to reduce the diameter of the beam while forming the through-holes 32 in the ceramic green sheet 20, the diameter of the through-hole 32 is increased upward.

As described above, various preferred embodiments of the present invention are useful for circuit substrates, circuit modules and methods for manufacturing circuit substrates, and are particularly superior in that they reduce the thicknesses of circuit substrates and circuit modules including circuit substrates.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a circuit substrate on which a first electronic component having a bump is to be mounted, the circuit substrate including a terminal to which the bump of the first electronic component is to be electrically connected, the method comprising the steps of:
    forming a mask layer on a portion of a main surface of a first sheet;
    forming a through-hole in the mask layer;
    filling the through-hole with a conductive material;
    stacking a plurality of second sheets and the first sheet having the mask layer such that the mask layer defines an uppermost layer, and compressing the stack to embed the mask layer in the first sheet; and
    removing the mask layer from the stack of the first sheet and the second sheets.

2. The method according to claim 1, wherein the mask layer is formed by applying a resin paste onto the first sheet in the step of forming the mask layer.

3. The method according to claim 1, wherein the through-hole is formed by irradiating the mask layer with a laser beam in the step of forming the through-hole.

4. The method according to claim 1, wherein the first sheet and the second sheets are ceramic green sheets, and the mask layer is made of a resin, and wherein the step of removing the mask layer is performed by firing the first sheet and the second sheets together with the mask layer, thereby consuming the mask layer.

5. The method according to claim 1, wherein the through-hole is formed so as to pass through the first sheet and the mask layer in the step of forming the through-hole.

6. The method according to claim 1, further comprising the steps of forming an electrode to which a second electronic component is to be joined, in a region other than the mask layer, and printing a solder paste on the electrode through a mask pattern.

* * * * *